(12) United States Patent
Carlson et al.

(10) Patent No.: US 10,176,288 B1
(45) Date of Patent: Jan. 8, 2019

(54) SYSTEM AND METHOD FOR PLACING COMPONENTS IN AN ELECTRONIC CIRCUIT DESIGN

(71) Applicant: Cadence Design Systems, Inc., San Jose, CA (US)

(72) Inventors: Brian James Carlson, Ottawa (CA); Frank X Farmar, Amherst, NH (US); Robert Paul White, Hudson, NH (US); Amey Vilas Joshi, Lexington, MA (US); Edmund J. Hickey, Amherst, NH (US)

(73) Assignee: Cadence Design Systems, Inc., San Jose, CA (US)

( * ) Notice: Subject to any disclaimer, the term of this patent is extended or adjusted under 35 U.S.C. 154(b) by 173 days.

(21) Appl. No.: 15/198,734

(22) Filed: Jun. 30, 2016

(51) Int. Cl.
*G06F 17/50* (2006.01)

(52) U.S. Cl.
CPC ...... *G06F 17/5072* (2013.01); *G06F 17/5081* (2013.01)

(58) Field of Classification Search
CPC ............ G06F 17/5068; G06F 17/5072; G06F 17/5081; G06F 17/5009; G06F 17/30271; G06F 17/50; G06F 17/5036; G06F 17/5045; G06F 17/5063; G06F 17/5077; G06F 2217/40; G06F 2217/74; G06F 3/0482; G06F 3/04842; G06F 3/04847
See application file for complete search history.

(56) References Cited

U.S. PATENT DOCUMENTS

| 6,976,236 | B1* | 12/2005 | Tain | G06F 17/5077 716/126 |
| 2009/0031273 | A1* | 1/2009 | Tsai | G06F 17/5068 716/119 |
| 2010/0070934 | A1* | 3/2010 | Tan | G06F 17/30271 716/106 |
| 2013/0025927 | A1* | 1/2013 | Andresen | H05K 1/114 174/266 |
| 2013/0198708 | A1* | 8/2013 | Suiter | G06F 17/5081 716/111 |
| 2014/0114617 | A1* | 4/2014 | Newhard | G06F 17/5068 703/1 |

(Continued)

*Primary Examiner* — Nha Nguyen
(74) *Attorney, Agent, or Firm* — Mark H. Whittenberger, Esq.; Holland & Knight LLP

(57) ABSTRACT

The present disclosure relates to a system and method for modeling the placement of components in an electronic circuit design. Embodiments may include receiving, at one or more computing devices, an electronic circuit design at a graphical user interface (GUI) and a selection for a component to be placed within the electronic circuit design. Embodiments may also include detecting a change in the position of the selected component to determine when the selected component is moved into a zone of the electronic circuit design. Embodiments may further include determining a component footprint and one or more padstacks associated with the component footprint for the selected component based upon the position of the selected component within the zone of the electronic circuit design. Embodiments may also include rendering the component footprint and the padstacks on the selected component based upon, at least in part, the position of the selected component.

20 Claims, 12 Drawing Sheets

(56) References Cited

U.S. PATENT DOCUMENTS

| | | | |
|---|---|---|---|
| 2015/0128102 A1* | 5/2015 | Perry | G06F 17/5072 |
| | | | 716/137 |
| 2015/0302130 A1* | 10/2015 | Hirschman | G06F 17/5072 |
| | | | 716/137 |
| 2015/0339421 A1* | 11/2015 | Srinivasan | G06F 17/5068 |
| | | | 716/139 |

* cited by examiner

SYSTEM AND METHOD FOR PLACING COMPONENTS IN AN ELECTRONIC CIRCUIT DESIGN

FIELD OF THE INVENTION

The present disclosure relates to electronic design automation (EDA), and more specifically, to a method for modeling and placing components in an electronic circuit design.

DISCUSSION OF THE RELATED ART

EDA utilizes software tools that may be used in the design and analysis of numerous electronic systems such as printed circuit boards (PCBs) and integrated circuits (ICs). Some EDA tools are configured to model electronic circuit designs. Often modeling electronic circuit designs may include selecting and placing components on top of, bottom of, internally or anywhere within a PCB. This requires the layout designer to manually select an appropriate footprint and padstacks associated with the footprint when placing the component. However, efficiency and accuracy in the placement of components on PCBs and selection of a footprint to use for the placed component is limited to the expertise of the layout designer placing the component. This process is further susceptible to human error when a layout engineer selects a footprint inappropriate for a particular placement location. Therefore, it may be of interest to develop a process to model and place components automatically in an electronic circuit design.

SUMMARY OF INVENTION

In one or more embodiments of the present disclosure, a computer-implemented method for modeling the placement of components in an electronic circuit design is provided. The method may include receiving, at one or more computing devices, an electronic circuit design at a graphical user interface (GUI) and a selection for a component to be placed within the electronic circuit design. The method may also include detecting a change in the position of the selected component to determine when the selected component is moved into a zone of the electronic circuit design and determining at least one of a component footprint and one or more padstacks associated with the component footprint for the selected component based upon, at least in part, the position of the selected component within the zone of the electronic circuit design. The method may further include rendering at least one or more of the component footprint and the one or more padstacks associated with the component footprint on the selected component based upon, at least in part, the position of the selected component.

One or more of the following features may be included. In some embodiments, the method may include receiving a placement position where the selected component is to be placed, determining at least one of the component footprint and the one or more padstacks associated with the component footprint for the selected component based upon, at least in part, a layer of one or more layers of the zone where the selected component is to be placed, and placing the selected component, with the component footprint and the one or more padstacks associated with the component footprint, on the layer of the one or more layers of the zone at the placement position. In some embodiments, determining at least one of a component footprint and one or more padstacks associated with the component footprint may be further based upon, at least in part, one or more mapping overrides associated with the selected component.

In some embodiments, determining the component footprint may be further based upon footprint mapping data associated with at least one of a placement side for the selected component and an original footprint name associated with the selected component. In some embodiments, the footprint mapping data may include at least one of default footprint mapping data and zone-specific footprint mapping data. The method may also include determining whether the zone-specific footprint mapping data includes a zone technology name; determining the component footprint for the selected component from the zone-specific footprint mapping data when the zone technology name is included in the zone-specific footprint mapping data; and determining the component footprint for the selected component from default footprint mapping data when at least one of: the zone technology is not included in the zone-specific footprint mapping data; there is no zone at the position of the selected component; and/or the zone-specific footprint mapping data defined for the zone technology name is empty. The method may also include selecting the original footprint for rendering on the selected component when the default footprint mapping data is empty. In some embodiments, the footprint mapping data may be at least one of: an indicator of none and an ordered list of alternate footprint names for the original footprint name.

The method may further include displaying an error indicating that the component is not allowed in the zone when the footprint mapping data is an indicator of none and removing the rendering of the component footprint from the selected component. In some embodiments, the method may also include selecting a first footprint, from the ordered list of alternate footprint names for the original footprint name, for rendering on the selected component when the footprint mapping data is an ordered list of alternate footprint names. The method may also include providing the ordered list of alternate footprint names on a menu associated with the GUI, and receiving a selection of an alternate footprint name from the ordered list of alternate footprint names, for rendering on the selected component.

In some embodiments, determining the one or more padstacks associated with the component footprint may be further based upon padstack mapping data associated with at least one of a placement side for the selected component and an original padstack name associated with the component footprint. In some embodiments, the padstack mapping data may include at least one of default padstack mapping data and zone-specific padstack mapping data. The method may also include determining whether the zone-specific padstack mapping data includes the zone technology name; determining the one or more padstacks from the zone-specific padstack mapping data when the zone technology name is included in the zone-specific padstack mapping data; and determining the one or more padstacks from the default padstack mapping data when at least one of: the zone technology is not included in the zone-specific padstack mapping data; there is no zone at the position of the selected component; and the zone-specific padstack mapping data defined for the zone technology name is empty.

The method may further include selecting the original padstack for rendering on the selected component when the default padstack mapping data is empty. In some embodiments, the padstack mapping data may be an alternate padstack name for the original padstack name. The method may also include selecting the alternate padstack for rendering on the selected component when the padstack mapping data is the alternate padstack name for the original padstack name.

In some embodiments, a computer-readable storage medium for modeling the placement of components in an electronic circuit design is provided. The computer-readable storage medium may have stored thereon instructions that when executed by a machine result in one or more operations. Operations may include receiving an electronic circuit design at a graphical user interface (GUI) and a selection for a component to be placed within the electronic circuit design. Operations may also include detecting a change in the position of the selected component to determine when the selected component is moved into a zone of the electronic circuit design. Operations may further include determining at least one of a component footprint and one or more padstacks associated with the component footprint for the selected component based upon, at least in part, the position of the selected component within the zone of the electronic circuit design. Operations may also include rendering at least one or more of the component footprint and the one or more padstacks associated with the component footprint on the selected component based upon, at least in part, the position of the selected component.

In one or more embodiments of the present disclosure, a system may include a computing device having at least one processor that may be configured to model the placement of components in an electronic circuit design. The at least one processor may be configured to receive an electronic circuit design at a graphical user interface (GUI) and a selection for a component to be placed within the electronic circuit design, the at least one processor may be configured to detect a change in the position of the selected component to determine when the selected component is moved into a zone of the electronic circuit design, the at least one processor may be configured to determine at least one of a component footprint and one or more padstacks associated with the component footprint for the selected component based upon, at least in part, the position of the selected component within the zone of the electronic circuit design, and the at least one processor configured to render at least one or more of the component footprint and the one or more padstacks associated with the component footprint on the selected component based upon, at least in part, the position of the selected component.

In one or more embodiments of the present disclosure, an additional computer-implemented method for modeling the placement of components in an electronic circuit design is provided. In some embodiments, the method may include receiving, at one or more computing devices, a selection for a component to be placed within an electronic circuit design. The method may also include receiving at least one of a position of the selected component within a portion of the electronic circuit design and a position where the selected component may be placed. The method may further include determining at least one of a component footprint and one or more padstacks associated with the component footprint for the component based upon at least one of the position of the selected component within the portion of the electronic circuit design and a layer of one or more layers of the portion of the electronic circuit design where the component may be placed. The method may also include rendering the component footprint and the one or more padstacks associated with the component footprint on the selected component. The method may further include placing the selected component with the component footprint and the one or more padstacks associated with the component footprint on the layer of the one or more layers of the portion of the electronic circuit design where the selected component is to be placed.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Embodiments of component placement process 10 shown in FIGS. 1-12 may provide an efficient approach for automatically placing components in an electronic circuit designs. In other words, embodiments disclosed herein may be configured to allow a user to select a component to place in the electronic circuit design and as the selected component is moved across different portions of the electronic circuit design, a component footprint and one or more padstacks may be automatically rendered on the selected component. The component footprint and the one or more padstacks may be determined based upon, at least in part, the position of the selected component. When a user identifies where the component will be placed, the component footprint and the one or more padstacks may be automatically determined based upon a layer of the portion of the electronic circuit design where the component will be placed.

Figure 1:
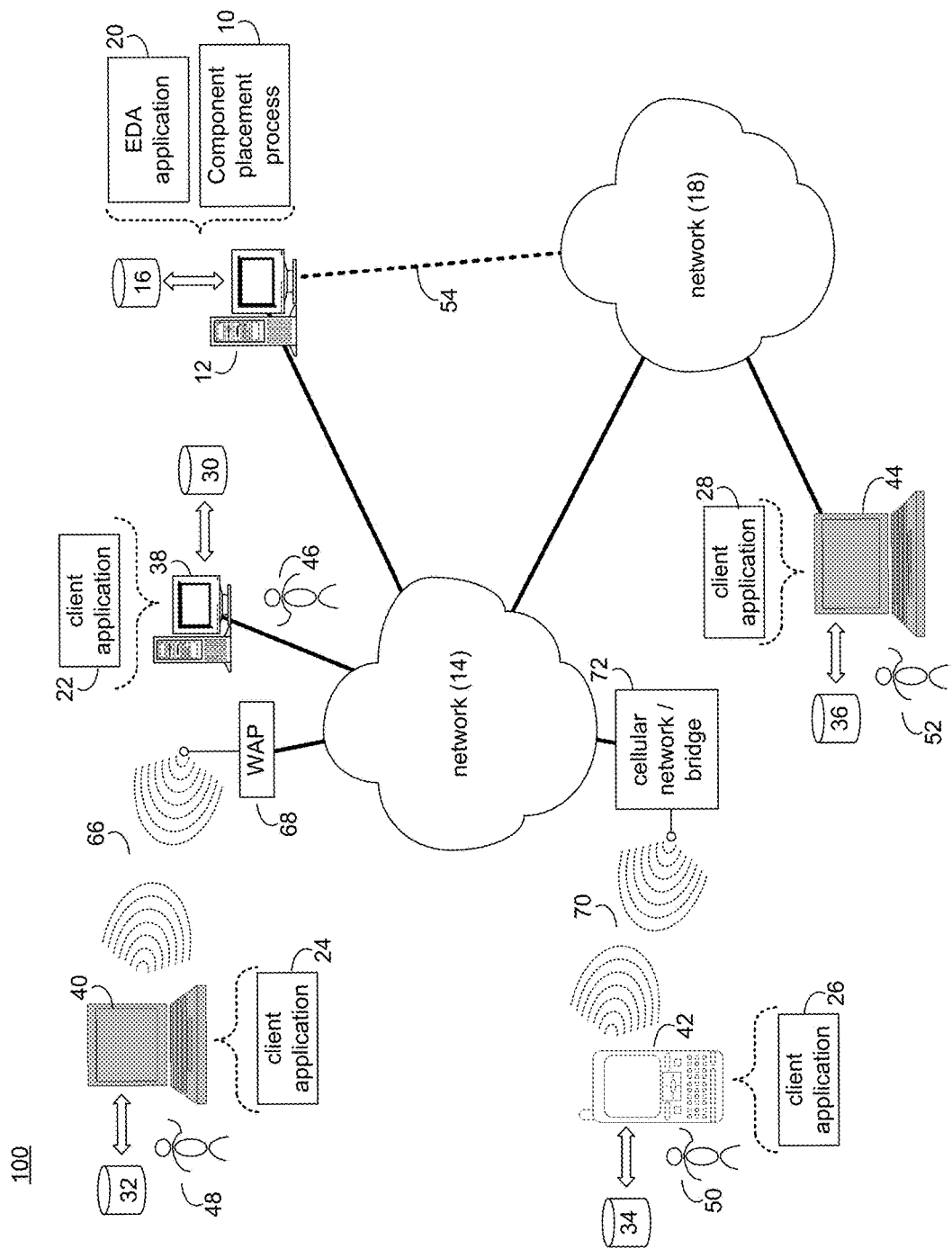
FIG. 1 is a system diagram depicting aspects of the component placement process in accordance with an embodiment of the present disclosure.

Referring to FIG. 1, there is shown component placement process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the component placement process may reside on and be executed, in whole or in part, by a client electronic device, such as a personal computer, notebook computer, personal digital assistant, or the like.

The instruction sets and subroutines of component placement process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Component placement process 10 may be a stand-alone application, or may be an applet/application/script that may interact with and/or be executed within EDA application 20. In addition/as an alternative to being a server-side process, the component placement process may be a client-side process (not shown) that may reside on a client electronic device (described below) and may interact with an EDA client application (e.g., one or more of EDA client applications 22, 24, 26, 28). Further, the component placement process may be a hybrid server-side/client-side process that may interact with EDA application 20 and an EDA client application (e.g., one or more of client applications 22, 24, 26, 28). As such, the component placement process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize component placement process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows®, Microsoft Windows CE®, Red Hat Linux®, or other suitable operating system. (Windows CE is a registered trademark of Microsoft Corporation in the United States, other countries, or both.).

Figure 2:
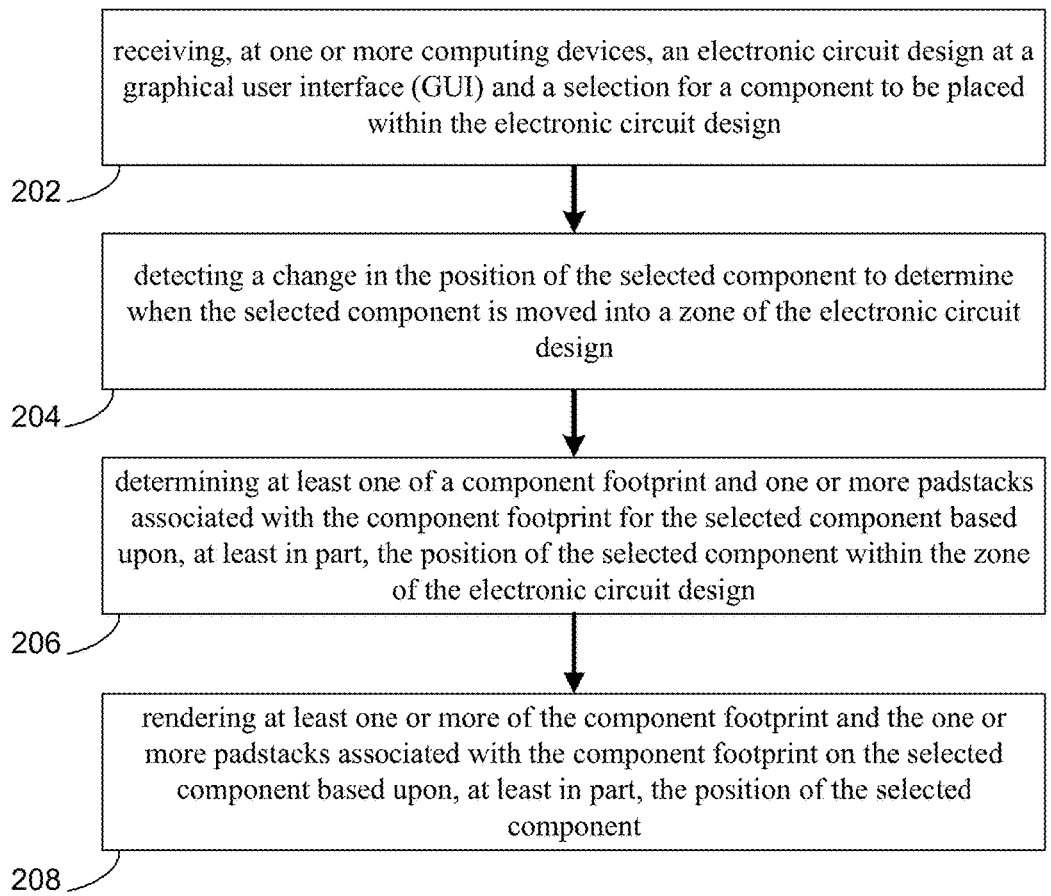
FIG. 2 is a flowchart depicting operations consistent with the component placement process of the present disclosure.

Referring to FIGS. 2-12, various embodiments consistent with component placement process 10 are provided. As shown in FIG. 2, embodiments of component placement process 10 may be configured to model and place components in an electronic circuit design. Embodiments of component placement process 10 may include receiving (202), at one or more computing devices, an electronic circuit design at a graphical user interface (GUI) and a selection for a component to be placed within the electronic circuit design. Component placement process 10 may also include detecting (204) a change in the position of the selected component to determine when the selected component is moved into a zone of the electronic circuit design. Component placement process 10 may further include determining (206) at least one of a component footprint and one or more padstacks associated with the component footprint for the selected component based upon, at least in part, the position of the selected component within the zone of the electronic circuit design. Component placement process 10 may also include rendering (208) at least one or more of the component footprint and the one or more padstacks associated with the component footprint on the selected component based upon, at least in part, the position of the selected component. These operations, and others, are discussed in further detail below.

In some embodiments, component placement process 10 may include receiving, at one or more computing devices, an electronic circuit design at a graphical user interface (GUI) and a selection for a component to be placed within the electronic circuit design. In some embodiments, the electronic circuit design may be received from a graphical user interface (GUI). In one example, component placement process 10 may be used in conjunction with the EDA application. The electronic circuit design may be received from the EDA application and/or component placement process 10 may be executed within or executed concurrently with an EDA application. An electronic circuit design as used herein may include, but is not limited to, a representation of an electronic circuit that may be designed, simulated, tested, and/or verified to enable an electronic circuit to carry out one or more instructions, as is known in the art. A component as used herein may include, but is not limited to, a software representation of one or more hardware components used in the modeling and/or simulation of an electronic circuit design. As will be discussed in greater detail below, a component may include one or more pins.

Figure 3:
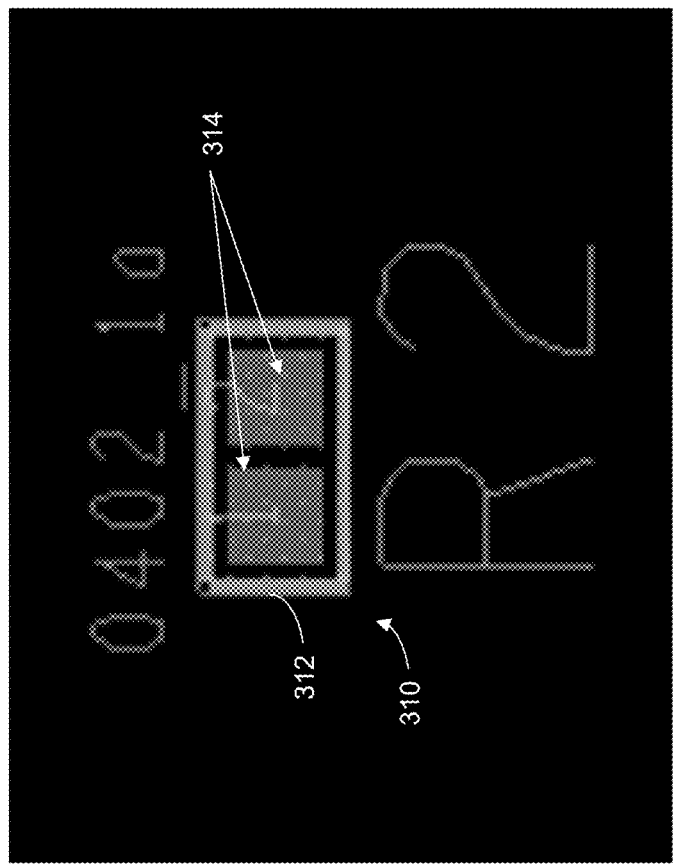
FIG. 3 is a schematic depicting a component with a component footprint and one or more padstacks associated with the component footprint in accordance with an embodiment of the present disclosure.
Figure 4:
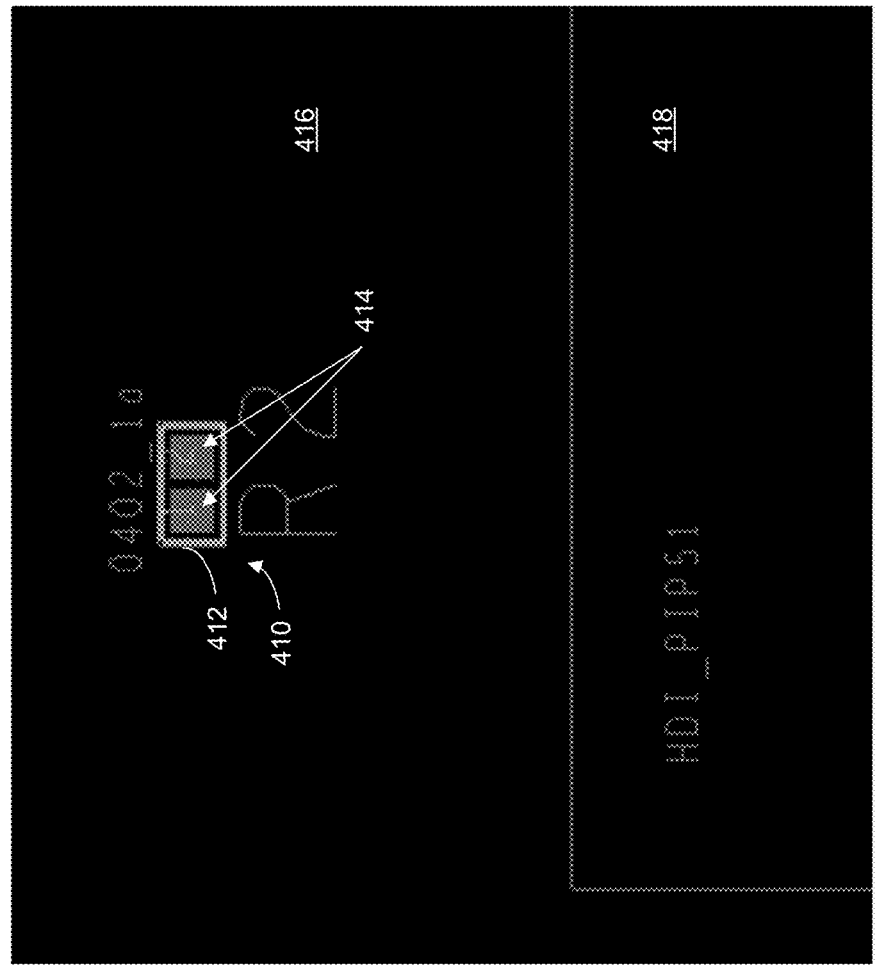
FIG. 4 is a schematic depicting aspects of the component placement process in accordance with an embodiment of the present disclosure.

In some embodiments and referring also to FIG. 3, a selected component 310 may be selected for placement in the electronic circuit design. As will be discussed in greater detail below, the selected component 310 may include a component footprint 312 and one or more padstacks 314 associated with the component footprint 312. Referring also to FIG. 4 and in one example, the electronic circuit design may include two zones, 416, 418. A zone as used herein may include, but is not limited to, an area or portion of an electronic circuit design representative of a printed circuit board (PCB) where each zone may be composed of different layer structures in order to support flexible areas, rigid areas, and/or bends. In some embodiments, a zone may be user-defined and/or defined by component placement process 10. In some embodiments, a zone may be defined by a user where the user draws and/or otherwise specifies the zone boundary in an EDA tool and selects a layer stackup structure and/or an optional zone technology name. In some embodiments, the zone definition and boundary may be user defined in another software tool, such as a mechanical CAD tool, and imported into the EDA tool to add one or more zones to the printed-circuit board. In one example, rigid zones may have one or more conducting layers with rigid material dielectric layers between them. In another example, in order to maintain flexibility, flex zones may have fewer layers with flexible dielectrics. In some embodiments, component placement process 10 may place components in these different zones by considering the different layer structure and material properties of the zone. Each zone 416, 418 may correspond to a different layer structure. While two zones have been described, an electronic circuit design may include any number of zones within the scope of the present disclosure.

In some embodiments, component placement process 10 may also include detecting a change in the position of the selected component to determine when the selected component is moved into a zone of the electronic circuit design. In some embodiments, detecting a change in the position of the selected component may include determining the zone of component placement based on the x-y location of the component (e.g., origin of the component), where "x" and "y" may correspond to perpendicular axes in a Cartesian plane. However, any coordinate system is within the scope of the present disclosure. In some embodiments, the selected component may be moved within the electronic circuit design by a user via a graphical user interface element. A graphical user interface element as used herein may include, but is not limited to, cursors, pointers, etc. In some embodiments, the selected component may be moved by using a keyboard, a touchscreen selection, etc. In some embodiments, the selected component may also be moved or placed by an automatic method, such as a software algorithm, or by importing coordinate positions for placement of the components from some other data source. In one example and as will be discussed in greater detail below, when the selected component is moved into or placed within a zone, component placement process 10 may determine at least one of a component footprint and one or more padstacks associated with the component footprint based upon, at least in part, the position and/or location of the selected component determined by component placement process 10 and/or from imported coordinates.

In some embodiments, as the selected component is moved across an electronic circuit design, the selected component may move into one or more zones. As will be discussed in greater detail below, as the selected component is moved into a different zone, component placement process 10 may automatically determine a component footprint and/or one or more padstacks associated with a component footprint for the selected component based upon, at least in part, the position of the selected component in the zone.

In some embodiments, a selected component may be located in and/or selected for placement in more than one zone such that a first portion of the selected component is in a first zone and a second portion of the selected component may be within and/or selected for placement within a second portion of the selected component is in a second zone. As will be discussed in greater detail below, one or more padstacks may be determined for each portion of the selected component located within each zone. For example, one or more padstacks may be determined for a first portion of a selected component within a first zone and one or more padstacks may be determined for a second portion of the selected component within a second zone.

In some embodiments, component placement process 10 may further include determining at least one of a component footprint and one or more padstacks associated with the component footprint based upon, at least in part, the position of the selected component within the zone of the electronic circuit design. A component footprint, or component land pattern, as used herein may include, but is not limited to, an arrangement of lands and/or pads used to physically attach and electrically connect a component to a printed circuit board. For example, a footprint on a circuit board may match the arrangement of leads on a component. A padstack as used herein may include, but is not limited to, a combination of letters and numbers that may represent a shape, or dimensions of lands and/or pads on different layers of a printed circuit board. Padstacks may be used in combination with the land pattern conventions established in the IPC-2220 Design standards. In some embodiments, padstacks may be specified for each pin of a component. For example, a selected component may include one or more pins. Component placement process 10 may determine one or more padstacks for each pin. In another example, component placement process 10 may determine a padstack for each pin of a selected component. Component placement process 10 may adjust a component footprint for the selected component based upon which conductor layers exist in the zone for lead to pad contact, and different requirements for pad size and shape depending on the material and layer properties of the zone in which the component may be placed. Non-conductor layers such as solder mask, solder paste and/or coverlay may or may not exist in the zone where the selected component is placed and may have different positive pad size, shape requirements, mask opening (hole) size, and/or shape requirements. The component footprint and/or one or more padstacks may also change on these non-conductor layers as components are moved between zones with different non-conductor layer structures, component footprint, and/or padstack requirements.

Figure 5:
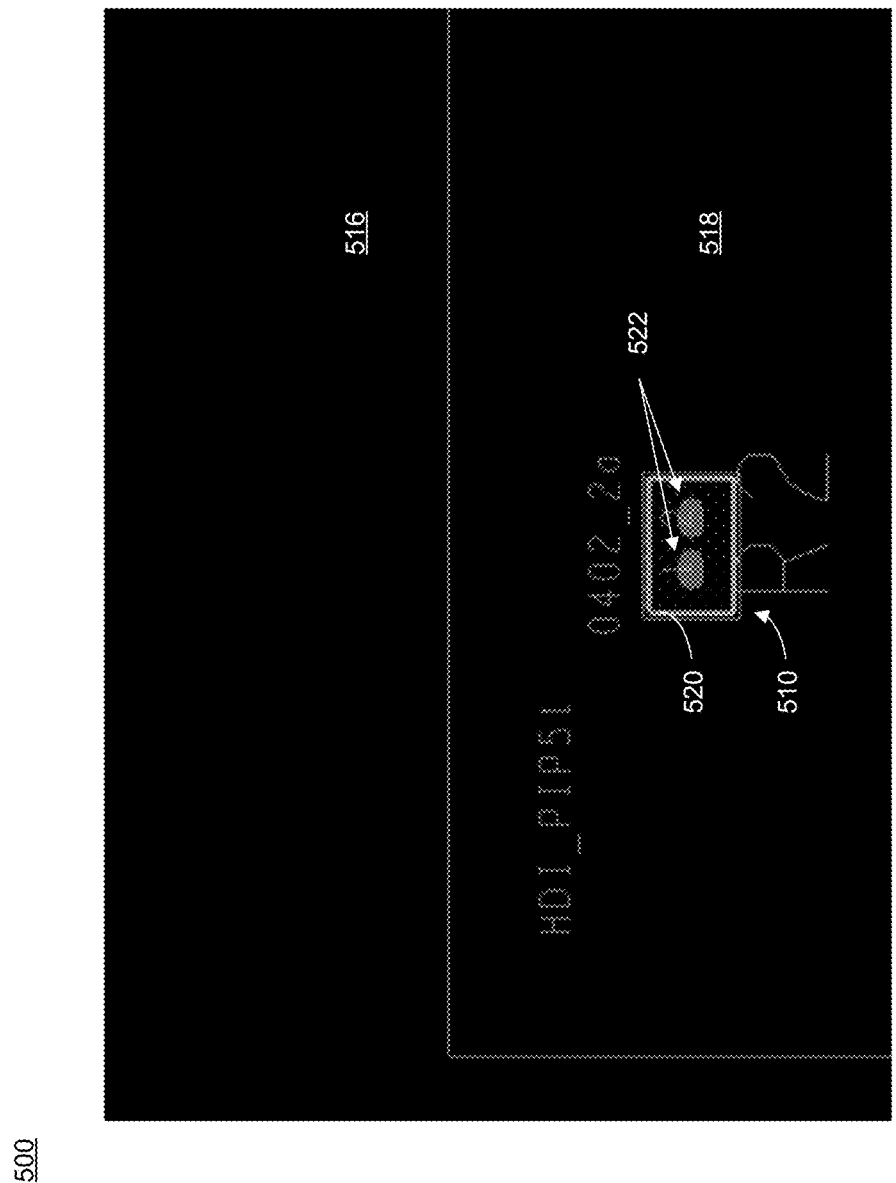
FIG. 5 is a schematic depicting aspects of the component placement process in accordance with an embodiment of the present disclosure.

In one example and referring also to FIGS. 4 and 5, the selected component 410 with component footprint 412 and padstacks 414 associated with the component footprint may be moved from a first zone 416 to a second zone 418. When the selected component 410 is moved into the second zone 418, a component footprint 520 and one or more padstacks 522 may be determined based upon, at least in part, the position of the selected component within the second zone 518. As will be discussed in greater detail below, the component footprint 520 and the one or more padstacks 522 associated with the component footprint 520 may be automatically rendered on the selected component 510 based upon, at least in part, the position of the selected component 510 within the second zone 518.

In some embodiments, determining the component footprint may be further based upon footprint mapping data associated with at least one of a placement side of the selected component and an original footprint name associated with the selected component. Footprint mapping data as used herein may include, but is not limited to, one or more possible component footprints that may be rendered on the selected component. A placement side as used herein may include, but is not limited to, a top, bottom, or embedded side/portion of the electronic circuit design. For example, a printed circuit board may include a top side, a bottom side, and the portion in between (e.g., embedded portion). In some embodiments, a selected component may be placed on the top side, the bottom side, or be embedded within a zone of the electronic circuit design. In some embodiments, the placement side for the selected component may be selected by a user. In one example, a user may select (via an option or menu associated with the GUI) to place the selected component on the top side of the electronic circuit design. While the above example references selecting the top side, any side or portion may be selected within the scope of the present disclosure. An original footprint name as used herein may include, but is not limited to, a footprint name specified by a library component that is associated with the selected component. In some embodiments, the footprint mapping data may also be associated with the position of the selected component.

Figure 6:
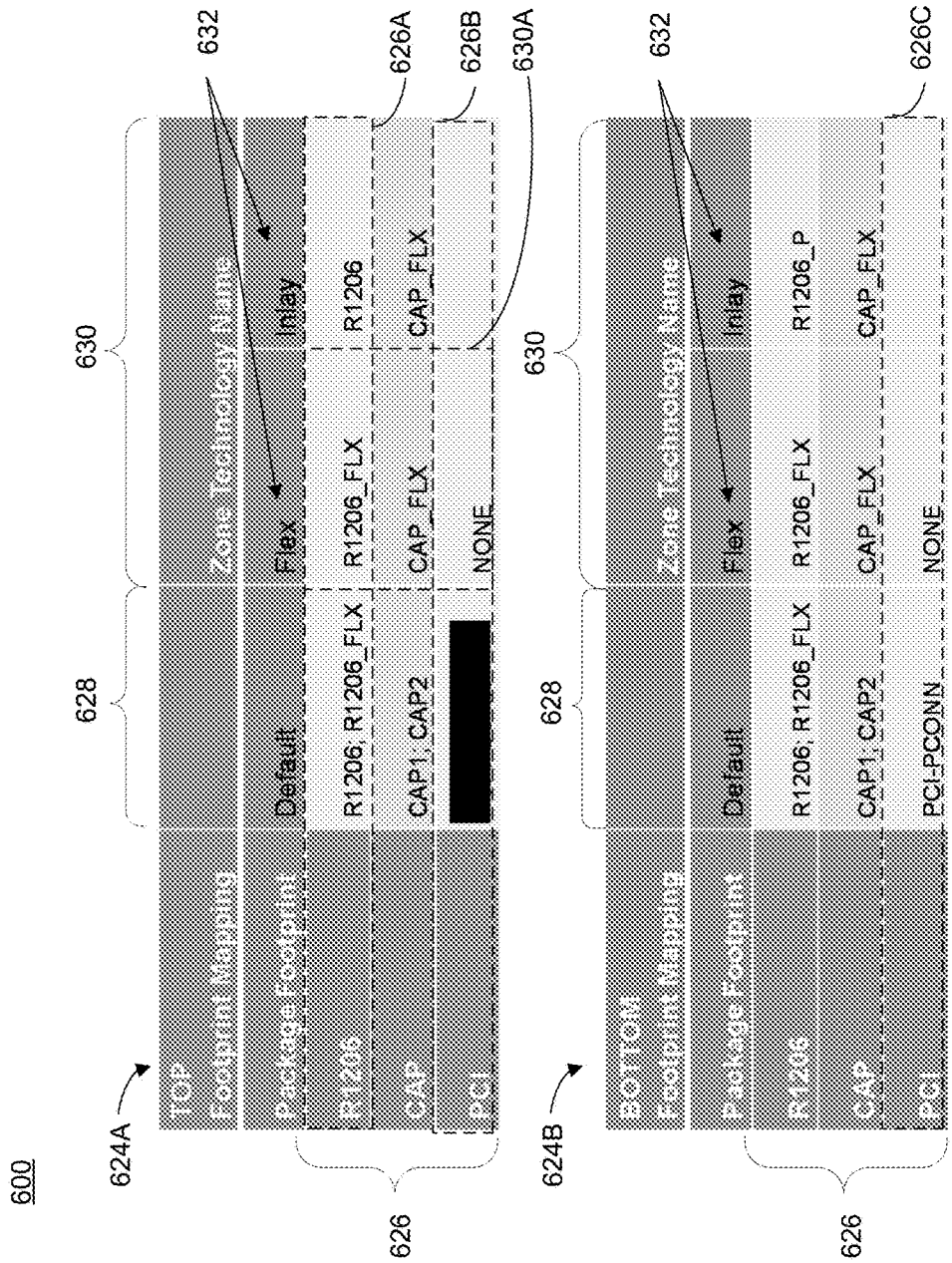
FIG. 6 is a footprint mapping table depicting aspects of the component placement process in accordance with an embodiment of the present disclosure.

In some embodiments and referring also to FIG. 6, footprint mapping data may be graphically represented by a footprint mapping table 600. The footprint mapping table 600 may include one or more portions 624A, 624B associated with the placement side of the selected component (e.g., top, bottom, embedded, etc.). In some embodiments, the footprint mapping table 600 may also include one or more portions 626 associated with the original footprint name associated with the selected component. In one example, the one or more portions 626 associated with the original footprint name may be represented as rows on the footprint mapping table 600. In one example, each row may be associated with an original footprint name associated with the selected component. As will be discussed in greater detail below, each column within the one or more portions 626, associated with the original footprint name, may represent a component footprint based upon, at least in part, the position of the selected component within a zone of the electronic circuit design.

In one example, a user may select a component for placement on a top side of an electronic circuit design. The original footprint name associated with the selected component may be "R1206". In this example, component placement process 10 may receive footprint mapping data associated with the placement side of the selected component (e.g., the top side in this example). Component placement process 10 may receive footprint mapping data 624A associated with the "TOP" placement side. Additionally and/or alternatively, component placement process 10 may receive footprint mapping data 626A associated with the original footprint name (e.g., "R1206") associated with the selected component.

In some embodiments, the footprint mapping data may include at least one of default footprint mapping data and zone-specific footprint mapping data. Default footprint mapping data as used herein may include, but is not limited to, one or more default component footprints. Referring again to FIG. 6 and in some embodiments, the footprint mapping data represented by footprint mapping table 600 may include a portion 628 associated with default footprint mapping data. In some embodiments, the footprint mapping data represented by footprint mapping table 600 may include one or more portions 630 associated with zone-specific footprint mapping data. Zone-specific footprint mapping data as used herein may include, but is not limited to, one or more zone-specific component footprints. In other words, zone-specific component footprints may include component footprints that may be used with the selected component for a given zone of the electronic circuit design.

In some embodiments, component placement process 10 may also include determining whether the zone-specific footprint mapping data includes a zone technology name associated with the position of the selected component. The zone technology name as used herein may describe the name and/or type of zone where the selected component is and/or will be placed. In some embodiments, the zone technology name may be defined by a user using a GUI. In some embodiments, the zone technology name may be defined as part of the footprint mapping table data. In one example, a user may assign one of the defined zone technology names to a particular zone. If one or more zones do not have a zone technology name assigned, component placement process 10 may use the default footprint mapping from the footprint mapping table, rather than zone-specific footprint mapping for those zones. In another example, a user may provide a character string zone technology to one or more zones. The character string may be used to search the footprint mapping table for a matching zone technology name. If a match is found, that matching footprint mapping may be used. If no match is found, then the default mapping may be used. For example and as discussed above, zones or portions of the electronic circuit design may be rigid, flexible, inlay, bent (e.g., a bend in the electronic circuit design), etc. Referring again to FIG. 6, the zone technology names 632 associated with the zone-specific footprint mapping data may be represented as column labels for the zone-specific footprint mapping data 630 on footprint mapping table 600. In one example, component placement process 10 may determine that the zone-specific footprint mapping data 630 for the original footprint name "R1206" may include the zone technology name "Flex".

In some embodiments, component placement process 10 may further include determining the component footprint for the selected component from the zone-specific footprint mapping data when the zone technology name is included in the zone-specific footprint mapping data. In one example and referring again to FIG. 6, a selected component with an original footprint name of "R1206", may have a "TOP" placement side and may be located in the "Flex" zone. Component placement process 10 may determine that the zone-specific footprint mapping data 630 (as shown for illustrative purposes on footprint mapping table 600) includes the zone technology name "Flex". Component placement process 10 may determine the component footprint "R1206_FLX" for the selected component from the zone-specific footprint mapping data for the "Flex" zone based upon, at least in part, the position of the selected component, the original footprint name 626A, and/or the placement side 624A for the selected component.

In some embodiments, the zone name and the zone technology name for a zone may be different. For example, the zone name may "Flex1", while the zone technology assigned to that zone may be "Flex". Another zone "Flex2" may also exist which uses the same zone technology "Flex" and may include the same mapping entries as "Flex1".

In some embodiments, component placement process 10 may also include determining the component footprint for the selected component from default footprint mapping data when at least one of the zone technology name is not included in the zone-specific footprint mapping data, there is no zone at the position of the selected component, and/or the zone-specific footprint mapping data defined for the zone technology name is empty. In one example and referring again to FIG. 6, a selected component with an original component footprint name of "R1206", may have a "TOP" placement side and may be located in the "Rigid" zone. Component placement process 10 may determine that the zone-specific footprint mapping data 630 (as shown for illustrative purposes on footprint mapping table 600) does not include the zone technology name "Rigid". Component placement process 10 may determine the component footprint "R1206" or "R1206_FLX" for the selected component from the default footprint mapping data based upon, at least in part, the position of the selected component, the original footprint name 626A, and/or the placement side 624A for the selected component.

In another example, a selected component with an original component footprint name of "PCI", may have a "BOTTOM" placement side and may be located in the "Inlay" zone. Component placement process 10 may determine that the zone-specific footprint mapping data 630 (as shown for illustrative purposes on footprint mapping table 600) includes the zone technology name "Inlay". Component placement process 10 may determine that the component footprint is empty based upon, at least in part, the position of the selected component, the original footprint name 626C, and/or the placement side 624B for the selected component. Component placement process 10 may determine the component footprint "PCI-PCONN" for the selected component from the default footprint mapping data because the zone-specific footprint mapping data for the "Inlay" zone is empty.

In some embodiments and as shown in FIG. 6, component placement process 10 may also include selecting the original footprint for rendering on the selected component when the default footprint mapping data is empty. In another example, component placement process 10 may determine that the zone-specific footprint mapping data 630 defined by the zone technology name is empty for the original footprint name "PCI" in the "Inlay" zone. Component placement process 10 may then determine that the default footprint mapping data is empty for the selected component and may render the original footprint (e.g., "PCI") on the selected component.

In some embodiments, the footprint mapping data (e.g., the zone-specific footprint mapping data and/or the default footprint mapping data) is at least one of: an indicator of none and/or an ordered list of alternate footprint names for the original component footprint name. In one example and referring again to FIG. 6, a selected component with an original footprint name of "PCI", may have a "TOP" placement side and may be located in the "Flex" zone. Component placement process 10 may determine that the zone-specific footprint mapping data 630 (as shown for illustrative purposes on footprint mapping table 600) includes the zone technology name "Flex". Component placement process 10 may determine that the component footprint is "NONE" (e.g., an indicator of none) for the selected component from the zone-specific footprint mapping data for the "Flex" zone based upon, at least in part, the position of the selected component, the original footprint name, and/or the placement side 624A for the selected component.

In some embodiments, component placement process 10 may further include displaying an error indicating that the selected component may not be allowed in the zone when the zone-specific footprint mapping data and/or the default footprint mapping data (e.g., the footprint mapping data) is an indicator of none and may remove the rendering of the component footprint from the selected component. Returning to the above example where component placement process 10 determined that the zone-specific footprint mapping data was an indicator of none for the selected component in the "Flex" zone, component placement process 10 may display an error indicating that the selected component is not allowed in the "Flex" zone. Component placement process 10 may also remove any rendering of the component footprint from the selected component. In some embodiments, component placement process 10 may also include displaying an error indicating that the component may not be allowed when the default footprint mapping data is an indicator of none and may remove the rendering of the component footprint from the selected component.

Figure 8:
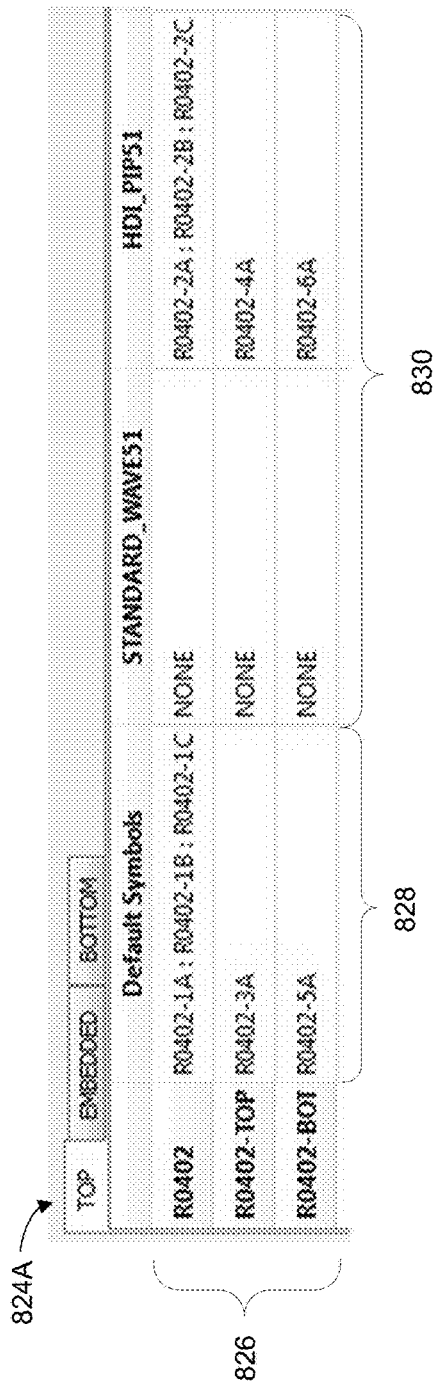
FIG. 8 is a footprint mapping table depicting aspects of the component placement process in accordance with an embodiment of the present disclosure.

In another example and referring also to FIGS. 5 and 8, a selected component 510 with an original component footprint name of "R0402", may have a "TOP" placement side and may be located in the "HDI_PIP51" zone 518. Component placement process 10 may determine that the zone-specific mapping data 830 (as shown for illustrative purposes on footprint mapping table 800) includes the zone technology name "HDI_PIP51". Component placement process 10 may determine the component footprint 520 from an ordered list of alternate footprint names for the original footprint name based upon, at least in part, the position of the selected component, the original footprint name, and/or the placement side 824A for the selected component.

In some embodiments, component placement process 10 may further include selecting a first footprint, from the ordered list of alternate footprint names for the footprint name, for rendering on the selected component when the zone-specific footprint mapping data and/or the default footprint mapping data (e.g., footprint mapping data) is an ordered list of alternate footprint names. In some embodiments, the ordered list of alternate footprint names may be defined by the library component associated with the selected component. Returning to the above example where component placement process 10 determined that the zone-specific footprint mapping data was an ordered list of alternate footprint names for the original footprint name, component placement process 10 may select a first footprint (e.g., "R0402-2a") for rendering from the ordered list of alternate footprint names.

In some embodiments, component placement process 10 may also include providing the ordered list of alternate footprint names on a menu associated with the GUI, and receiving a selection of an alternate footprint name from the ordered list of alternate footprint names, for rendering on the selected component. In one example, a user may access the ordered list of alternate footprint names by selecting a menu (e.g., a "right click"). In another example, the ordered list of alternate footprint names may be displayed in a pre-existing menu within the GUI. In some embodiments, as the selected component is moved into a zone of the electronic circuit design, the ordered list of alternate footprint names on the menu associated with the GUI may be updated automatically based upon, at least in part, the position of the selected component in the zone of the electronic circuit design.

Figure 7:
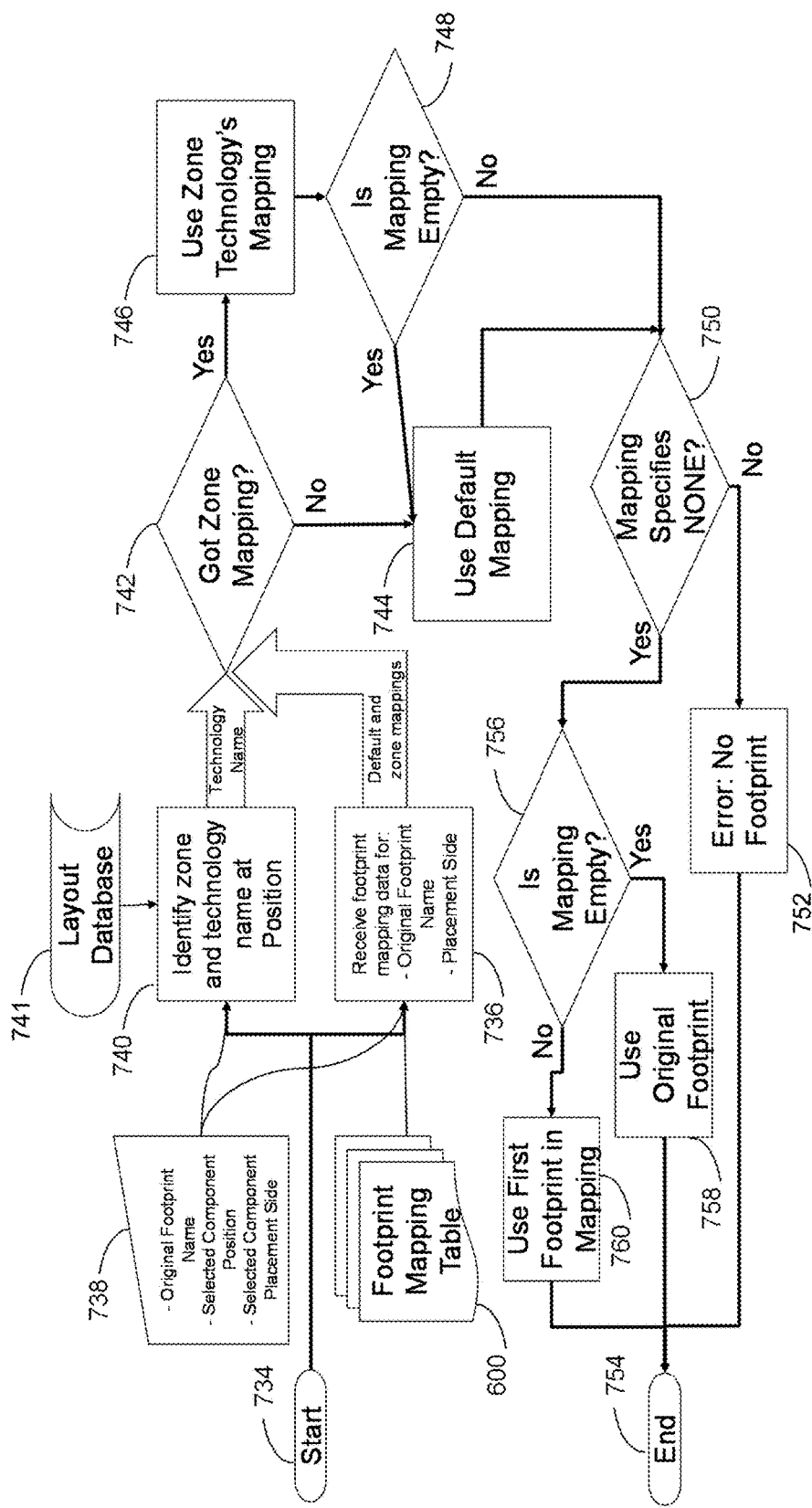
FIG. 7 is a flowchart depicting operations for determining a component footprint consistent with the component placement process of the present disclosure.

In some embodiments, and as shown in the example flowchart of FIG. 7, component placement process 10 may determine a component footprint for the selected component. An example function 700 of component placement process 10 may start 734 and receive 736 footprint mapping data associated with at least one of the placement side of the selected component and the original footprint name associated with the selected component. The placement side of the selected component and the position of the selected component may be received from the GUI 738. In some embodiments, the original footprint name may be received from a library component and/or from a user. Function 700 may identify 740 which zone the selected component is in and/or will be placed in and for that zone, identify the zone technology name. If a zone technology name is identified at action 740, function 700 may search 742 for the zone technology name in the zone-specific footprint mapping data. If the zone technology name is not included in the zone-specific footprint mapping data, function 700 may use 744 the default footprint mapping data to determine the component footprint. If the zone technology name is included in the zone-specific footprint mapping data, function 700 may use 746 the zone-specific footprint mapping data to determine the component footprint.

In some embodiments, function 700 may determine 748 if the zone-specific footprint mapping data is empty. If the zone-specific footprint mapping data is empty, function 700 may use 744 the default footprint mapping data to determine the component footprint. If the zone-specific footprint mapping data is not empty and/or the default footprint mapping data is being used, function 700 may determine 750 if the default footprint mapping data and/or the zone-specific footprint mapping data specifies "NONE". If function 700 determines that the default footprint mapping data and/or the zone-specific footprint mapping data specifies none, function 700 may display 752 an error indicating that the component is not allowed in the zone and function 700 may end 754. If the default footprint mapping data and/or the zone-specific footprint mapping data does not specify "NONE", function 700 may determine 756 if the zone-specific footprint mapping data and/or the default footprint mapping data is empty. If the zone-specific footprint mapping data and/or the default footprint mapping data is empty, function 700 may use 758 the original component footprint and end 754. If the zone-specific footprint mapping data and/or the default footprint mapping data is empty, function 700 may use 760 the original component footprint and end 754.

In some embodiments, determining the one or more padstacks associated with the component footprint may be further based upon padstack mapping data associated with at least one of: a placement side for the component and an original padstack name associated with the component footprint. In some embodiments, the one or more padstacks may be determined based on the specific component instance (e.g., the selected component) and/or based on the user manually selecting a padstack name (e.g., an original padstack name) to use. As will be discussed in greater detail below, a user may choose a specific padstack name to apply to a particular pin of a component instance (e.g., a selected component).

In some embodiments, component placement process 10 may first determine a component footprint and then second determine the one or more padstacks associated with the component footprint. Padstack mapping data as used herein may include, but is not limited to, one or more possible padstacks, associated with a component footprint, that may be rendered on the selected component. In some embodiments, the padstack mapping data may also be associated with the position of the selected component. An original padstack name as used herein may include, but is not limited to, a padstack name specified by a library component that is associated with the component footprint and/or the selected component.

In some embodiments, determining the one or more padstacks associated with the component footprint may be based on the placement location of a specific pin for which the padstack is being rendered. In some embodiments, a selected component may be placed such that one or more of its pins are in one zone and others are in a different zone. In one example, a selected component may have a portion in a first zone and a portion in a second zone. In this example, if the zones map the same original padstack name to different final padstack names for each of the first and second zones, the pins in each zone may have different final padstacks even though they may have started with the same original padstack name.

Figure 9:
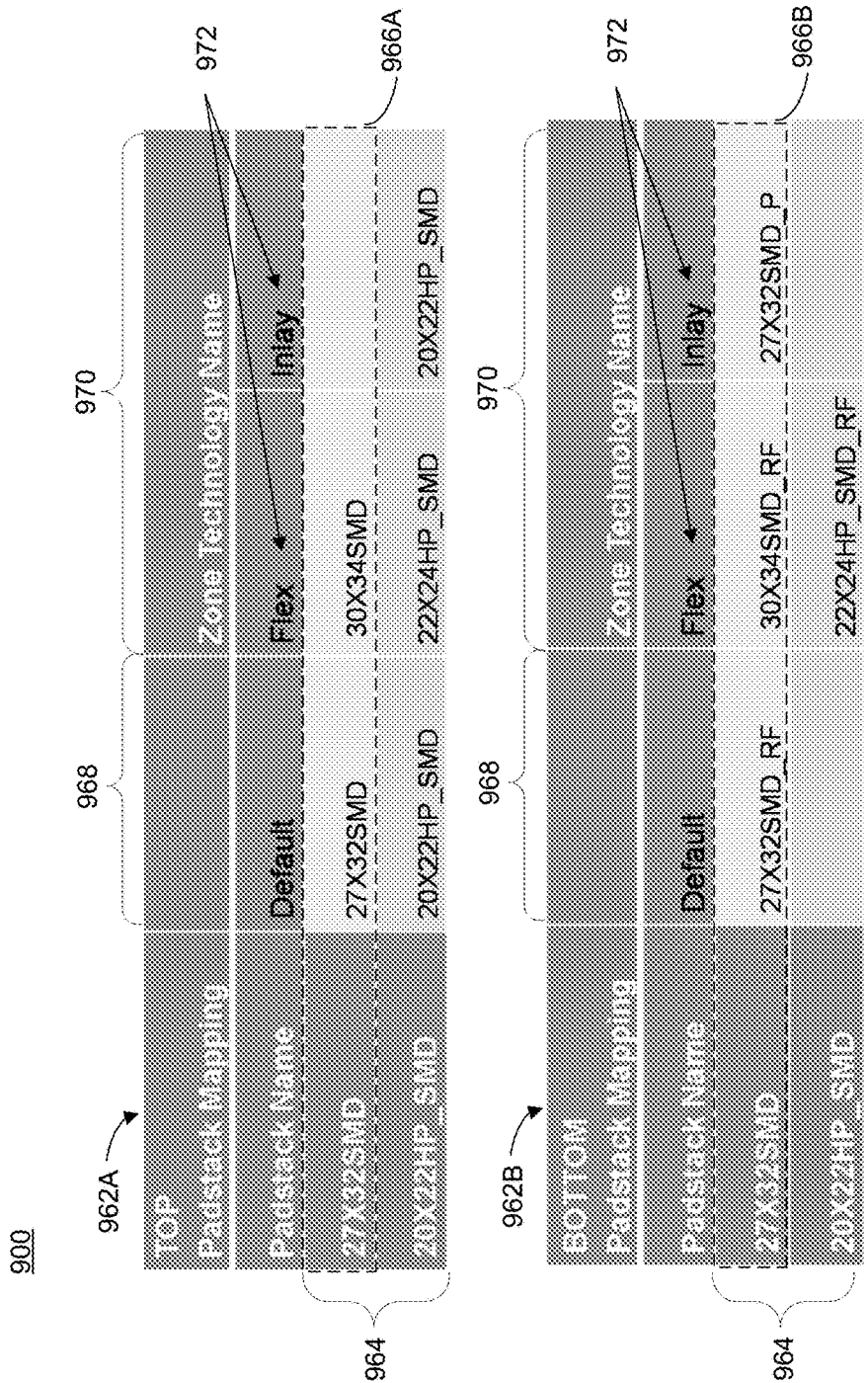
FIG. 9 is a padstack mapping table depicting aspects of the component placement process in accordance with an embodiment of the present disclosure.

In some embodiments and referring also to FIG. 9, padstack mapping data may be graphically represented by a padstack mapping table 900. The padstack mapping table 900 may include one or more portions 962A, 962B associated with the placement side of the selected component (e.g., top, bottom, embedded, etc.). In some embodiments, the padstack mapping table 900 may also include one or more portions 964 associated with the original padstack name associated with the selected component and/or the component footprint. In one example, the one or more portions 964 associated with the original padstack name associated with the selected component may be represented as rows on the padstack mapping table 900. In one example, each row may be associated with an original padstack name associated with the selected component. As will be discussed in greater detail below, each column within the one or more portions 964 associated with the original padstack name may represent a component padstack based upon, at least in part, the position of the selected component and/or pin of the selected component within a zone of the electronic circuit design.

In one example, a user may select a component for placement on a top side of an electronic circuit design. The original padstack name associated with the selected component and/or the component footprint may be "27X32SMD". In this example, component placement process 10 may receive padstack mapping data associated with the placement side of the selected component (e.g., the top side in this example). Component placement process 10 may receive padstack mapping data 964A associated with the "TOP" placement side. Additionally and/or alternatively, component placement process 10 may receive padstack mapping data 966A, 966B (based on whether the placement side is "TOP" or "BOTTOM") associated with the original padstack name (e.g., "27X32SMD") associated with the selected component.

In some embodiments, the padstack mapping data may include at least one of default padstack mapping data and zone-specific padstack mapping data. Default padstack mapping data as used herein may include, but is not limited to, one or more default component padstacks. Referring again to FIG. 9 and in some embodiments, the padstack mapping data represented by padstack mapping table 900 may include a portion 968 associated with default padstack mapping data. In some embodiments, the padstack mapping data represented by padstack mapping table 900 may include one or more portions 970 associated with zone-specific padstack mapping data. Zone-specific padstack mapping data as used herein may include, but is not limited to, one or more zone-specific component padstacks. In other words, a zone-specific component padstack may include a padstack that may be used with the selected component and/or the component footprint for a given zone of the electronic circuit design. In some embodiments, a zone-specific padstack may also be used with a zone-specific component footprint, as discussed above. In some embodiments, a zone-specific padstack may be associated with the zone-specific component footprint.

In some embodiments, component placement process 10 may also include determining whether the zone-specific padstack mapping data includes the zone technology name associated with the position of the selected component. Referring again to FIG. 9, the zone technology names 972 associated with the zone-specific padstack mapping data may be represented as column labels for the zone-specific padstack mapping data 970 on padstack mapping table 900. In one example, component placement process 10 may determine that the zone-specific padstack mapping data 970 for the original padstack name "27X32SMD" may include the zone technology name "Flex".

In some embodiments, component placement process 10 may further include determining the one or more padstacks from the zone-specific padstack mapping data when the zone technology name is included in the zone-specific padstack mapping data. In one example and referring again to FIG. 9, a selected component with an original padstack name of "27X32SMD", may have a "TOP" placement side and may be located in the "Flex" zone. Component placement process 10 may determine that the zone-specific padstack mapping data 970 (as shown for illustrative purposes on padstack mapping table 900) includes the zone technology name "Flex". Component placement process 10 may determine the padstack "30X34SMD" for the selected component and/or the component footprint from the zone-specific padstack mapping data for the "Flex" zone based upon, at least in part, the position of the selected component, the original footprint name 966A, and/or the placement side 962A for the selected component.

In some embodiments, component placement process 10 may also include determining the one or more padstacks from the default padstack mapping data when at least one of: the zone technology is not included in the zone-specific padstack mapping data, there is no zone at the position of the selected component, and/or the zone-specific padstack mapping data defined for the zone technology name is empty. In one example and referring again to FIG. 9, a selected component with an original padstack name of "27X32SMD", may have a "TOP" placement side and may be located in the "Rigid" zone. Component placement process 10 may determine that the zone-specific padstack mapping data 970 (as shown for illustrative purposes on footprint mapping table 900) does not include the zone technology name "Rigid". Component placement process 10 may determine the padstack "27X32SMD" for the selected component from the default padstack mapping data based upon, at least in part, the position of the selected component, the original padstack name 966A, and/or the placement side 962A for the selected component.

In another example and referring again to FIG. 9, a selected component with an original padstack name of "27X32SMD", may have a "TOP" placement side and may be located in the "Inlay" zone. Component placement process 10 may determine that the zone-specific padstack mapping data 970 (as shown for illustrative purposes on footprint mapping table 900) includes the zone technology name "Inlay". Component placement process 10 may determine that the zone-specific padstack mapping data is empty. Component placement process 10 may determine the component footprint "27X32SMD" for the selected component from the default footprint mapping data because the zone-specific footprint mapping data for the "Inlay" zone is empty.

In some embodiments, the padstack mapping data (e.g., zone-specific padstack mapping data and/or default padstack mapping data) may be an alternate padstack name for the original padstack name. In one example and referring again to FIG. 9, a selected component with an original padstack name of "27X32SMD", may have a "TOP" placement side and may be located in the "Flex" zone. Component placement process 10 may determine that the zone-specific padstack mapping data 970 (as shown for illustrative purposes on padstack mapping table 900) includes the zone technology name "Flex". Component placement process 10 may determine the alternate padstack name "30X34SMD" for the selected component and/or the component footprint from the zone-specific padstack mapping data for the "Flex" zone based upon, at least in part, the position of the selected component, the original padstack name 966A, and/or the placement side 962A for the selected component. In another example, a selected component with an original component padstack name of "27X32SMD", may have a "TOP" placement side and may be located in the "Rigid" zone. Component placement process 10 may determine that the zone-specific padstack mapping data 970 (as shown for illustrative purposes on padstack mapping table 900) does not include the zone technology name "Rigid". Component placement process 10 may then determine the alternate padstack name "27X32SMD" from the default padstack mapping data.

In some embodiments, component placement process 10 may also include selecting the alternate padstack for rendering on the selected component and/or a pin of the selected component when the padstack mapping data is the alternate padstack name. Returning to the above example where component placement process 10 determined the alternate padstack name to be "27X32SMD" from the default padstack mapping data, component placement process 10 may render the alternate padstack "27X32SMD" on the selected component and/or a pin of the selected component.

In some embodiments, component placement process 10 may further include selecting the original padstack for rendering on the selected component and/or a pin of the selected component when the padstack mapping data is empty. In another example and referring again to FIG. 9, a selected component with an original component padstack name of "20X22HP_SMD", may have a "BOTTOM" placement side and may be located in the "Inlay" zone. Component placement process 10 may determine that the zone-specific padstack mapping data 970 (as shown for illustrative purposes on padstack mapping table 900) includes the zone technology name "Inlay". Component placement process 10 may then determine that the zone-specific padstack mapping data for "Inlay" is empty. Component placement process 10 may also determine that the default padstack mapping data is empty and may select the original padstack name "20X22HP_SMD" for rendering.

Figure 10:
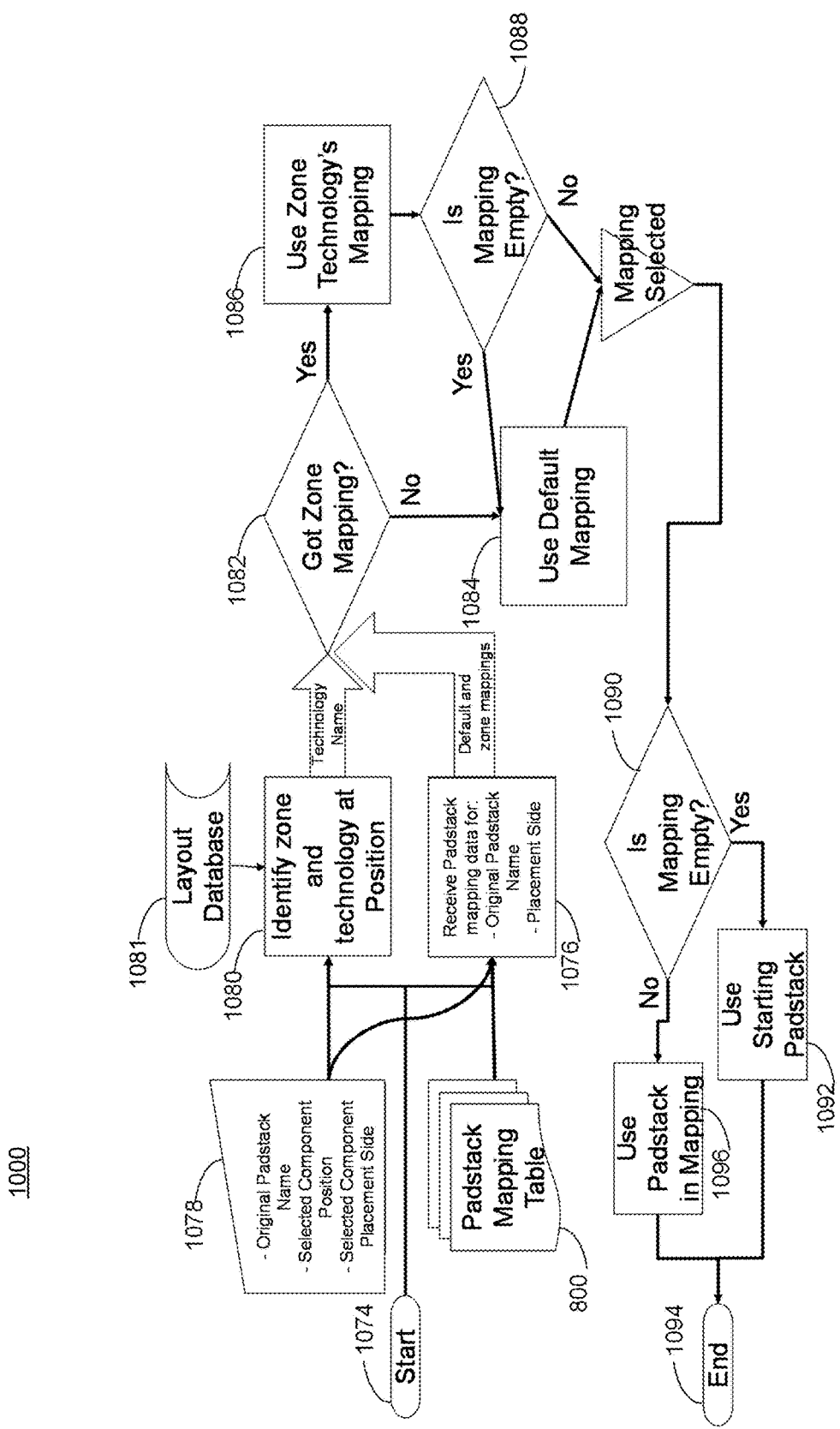
FIG. 10 is a flowchart depicting operations for determining one or more padstacks consistent with the component placement process of the present disclosure.

In some embodiments, and as shown in the example flowchart of FIG. 10, component placement process 10 may determine one or more padstacks associated with the component footprint for the selected component. An example function 700 of component placement process 10 may start 1074 and receive 1076 padstack mapping data associated with at least one of the placement side of the selected component and the original padstack name associated with the selected component. The placement side of the selected component and the position of the selected component may be received from the GUI 1078. In some embodiments, the original padstack name may be received from the padstack mapping table 800. Function 700 may identify which zone the selected component is in and for that zone, identify the zone technology name. If a zone technology name is identified at action 1080, function 700 may search 1082 for the zone technology name in the zone-specific padstack mapping data. If the zone technology name is not included in the zone-specific padstack mapping data, function 700 may use 1084 the default padstack mapping data to determine the one or more padstacks associated with the component footprint. If the zone technology name is included in the zone-specific padstack mapping data, function 700 may use 1086 the zone-specific padstack mapping data to determine the one or more padstacks associated with the component footprint.

In some embodiments, function 700 may determine 1088 if the zone-specific padstack mapping data is empty. If the zone-specific padstack mapping data is empty, function 700 may use 1084 the default padstack mapping data. Function 700 may determine 1090 if the padstack mapping data (e.g., the zone-specific padstack mapping data and/or the default padstack mapping data) is empty. If the padstack mapping data is empty, function 700 may use 1092 the original padstack (e.g., starting padstack) and end 1094. If the padstack mapping data is not empty, function 700 may use 1096 the alternate padstack name and end 1094.

In some embodiments, component placement process 10 may also include rendering at least one or more of the component footprint and the one or more padstacks associated with the component footprint on the selected component based upon, at least in part, the position of the selected component. Referring again to FIGS. 4 and 5, component placement process 10 may determine the component footprint and/or the one or more padstacks associated with the component footprint for the selected component based upon, at least in part, the position of the selected component 410 in the first zone 416 of the electronic circuit design. Component placement process 10 may render the component footprint 412 and/or the one or more padstacks 414 on the selected component (e.g., on a cursor) while the selected component is within the first zone 416. However, the selected component 410 may be moved (e.g., by a cursor) across a zone boundary into a second zone 518. Component placement process 10 may detect a change in the position of selected component 510 and determine the component footprint and/or one or more padstacks for the selected component 510 in the second zone 518. The component footprint 520 and/or the one or more padstacks 522 for the second zone 518 may be rendered on the selected component (e.g., on a cursor) while the selected component 510 is within the second zone 518.

In some embodiments, component placement process 10 may include receiving a placement position where the component is to be placed. In some embodiments, a user may determine where the selected component is to be placed (e.g., the placement position). In some embodiments, component placement process 10 may include determining at least one of the component footprint and the one or more padstacks associated with the component footprint for the component based upon, at least in part, a layer of one or more layers of the zone where the component is to be placed, as discussed above. The menu of alternative footprints may also be updated when the placement position is received. In some embodiments, determining at least one of the component footprint and the one or more padstacks may include testing the origin of the component (e.g., the "x" and "y" position of the selected component as defined by the GUI) to determine if the component is being placed in a zone of the electronic circuit design. In some embodiments, determining at least one of the component footprint and the one or more padstacks may include determining if the placement position is within a zone of the electronic circuit design. If the selected component and/or the placement position is not within a zone, component placement process 10 may use a primary stackup. A primary stackup as used herein may include, but is not limited to, a standard placement for pins of a component on portion of the electronic circuit design.

If the selected component is placed and/or the placement position is within a zone, component placement process 10 may receive the start and end layers from the stackup (or layer stackup) assigned to the zone. In some embodiments, one or more layer stackup structures, including conductor layers and/or nonconductor layers (including dielectric and mask layers), all in a required manufacturing order, may be defined as a layer stackup object, by a user and/or by importing technology information that includes the stackup definitions. When a zone is created as part of the design, either by the user or by importing zone definitions, one of the existing layer stackups may be assigned to the zone. The start and end layers for the zone may be determined from the stackup assigned for use by that zone. Any one zone may have one or more one stackups assigned. In one example, one zone may only have one stackup assigned. Component placement process 10 may create a padstack reference defined from the zone's start layer to the end layer for each pin and via in the component footprint. In other words, pad definitions may be mapped to layers defined in a pad reference.

In some embodiments, for surface mount component landing pads, the padstack may contain only one conductor pad. However, the inclusion of additional conductor pads is within the scope of the present disclosure. Component placement process 10 may automatically map the single pad from the padstack definition to the appropriate top or bottom most layer of the zone for use by the padstack reference (e.g., determined by whether the selected component is placed on TOP or BOTTOM side of the zone, since surface mount components may be placed on either the top or bottom surface of the zone). When the same component is placed in one zone and then moved to another zone, the landing pad may be moved to the new top or bottom surface layer in the destination zone if that zone uses a different layer stackup with a different top or bottom surface layer than that used in the source zone where the component was originally placed. Similarly, if the padstack has pads for various mask layers, such as solder mask or coverlay, the padstack reference for placement of the component in the zone may have the actual mask pad or opening rendered on the specific mask layer corresponding to the conductor layer on which the conductor landing pad was rendered. This may be because for manufacturing purposes the manufacturing output mask may be different for each conductor layer that is a surface layer for some zone, so each such conductor layer that is the surface of a zone has its own mask layer for each mask that exists in that zone (e.g. solder mask, solder paste, coverlay, etc.). In some embodiments, shapes within the component footprint on surface layers may be mapped to the zone's (e.g., zone of the placement position) actual surface layers and shapes may be created on the zone's actual layers (e.g., placement of the selected component).

Figure 11:
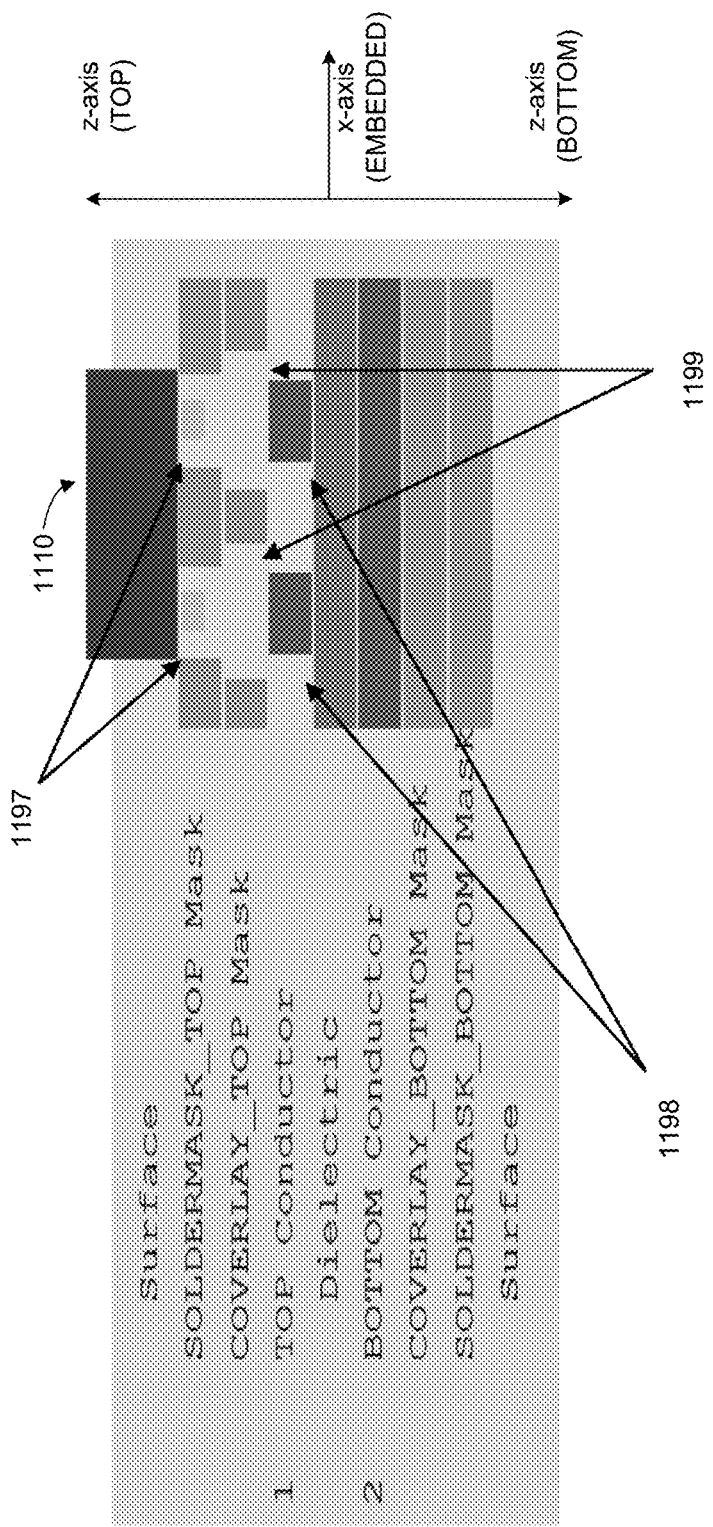
FIG. 11 is a schematic depicting aspects of the component placement process in accordance with an embodiment of the present disclosure.
Figure 12:
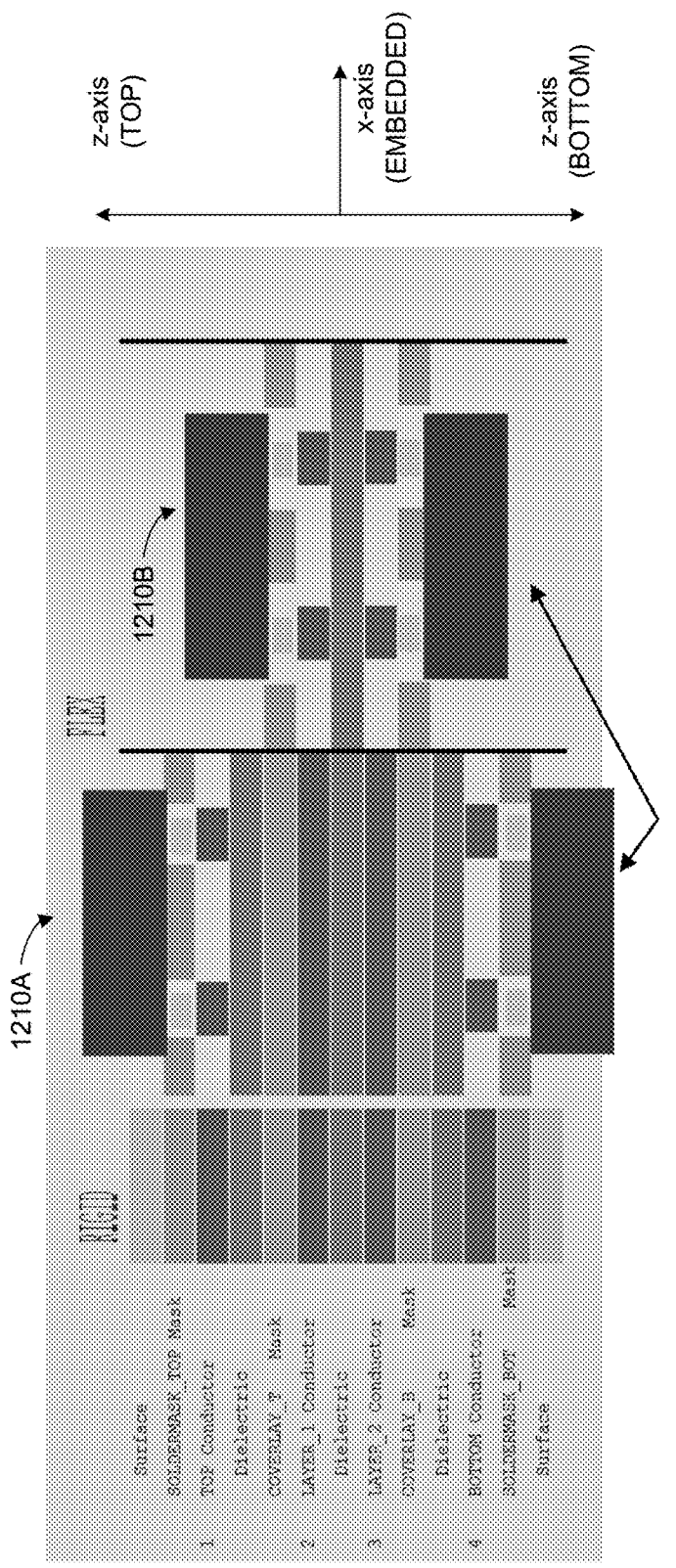
FIG. 12 is a schematic depicting aspects of the component placement process in accordance with an embodiment of the present disclosure.

In some embodiments and referring also to FIGS. 11 and 12, an original footprint 1100 and zone-specific component footprints 1200 may be defined for a selected component. The original footprint 1100 may include a selected component 1110 positioned on a layer of one or more layers of the electronic circuit design, one or more of coverlay mask openings 1197, conductor pads 1198, and solder mask openings 1199. In one example and referring again to FIGS. 4-5, the library footprint 412 and one or more padstacks 414 may be rendered on the selected component 410 while the selected component 410 is within the first zone 416. When the selected component 410 is moved to the second zone 518, component placement process 10 may determine a component footprint and/or one or more padstacks associated with the component footprint. In some embodiments, component placement process 10 may render the component footprint 520 and the one or more padstacks 522 associated with the component footprint on the selected component 510 while the selected component 510 is within the second zone 518. In some embodiments, a placement location may be received while the selected component 510 is within the second zone 518. Component placement process 10 may automate creation of conductor pads and mask openings on the second layer 518 of the zone based upon, at least in part, the placement position (e.g., zone), the placement side of the selected component (e.g., top or bottom side of board, or embedded), and/or the layer stackup used in the zone.

In some embodiments, component placement process 10 may include placing the selected component, with at least one of the component footprint and the one or more padstacks associated with the component footprint, on the layer of the one or more layers of the zone at the placement position. Continuing with the above example, the second zone 518 may be "rigid" as shown in FIG. 12. In some embodiments, the zone-specific component footprints 1200 may include one or more selected components with various placement sides 1210A, 1210B, 1210C, 1210D positioned on a layer of the one or more layers of the zone. In this example, the selected component 510 may be placed at a placement position in the second zone 518. Component placement process 10 may determine the component footprint 520 and the one or more padstacks 522 associated with the component footprint for the selected component based upon, at least in part, the placement position of the selected component 510 within the second zone 518. In this example and as shown in FIG. 12, placement of the selected component on the layer of the one or more layers of the zone at the placement position may include suppressing the coverlay openings 1197 (e.g., because the layer stackup used by the "rigid" zone may not include a coverlay layer) and creating conductor pads 1198 (as shown in FIG. 11) on the exposed conductor layer at the placement side of the selected component (e.g., top, bottom, or embedded within). In some embodiments, a layer stackup used by a zone may determine whether a coverlay, solder mask, mask layer, etc. is included in the zone. Returning to the above example, the "rigid" zone may include a solder mask, in which case if the padstack has a solder mask pad, that pad may be rendered on the solder mask layer associated with the surface conductor layer on which the selected component is placed in that zone.

In another example where the second zone 518 may be "flex" as shown in a portion of FIG. 12, placement of the selected component on the layer of the one or more layers of the zone at the placement position may include suppressing the solder mask openings 1199 (e.g., because the "flex" zone may not include a solder mask layer) and creating conductor pads 1198 on the exposed conductor layer at the placement side of the selected component 510.

In some embodiments, component placement process 10 may include determining at least one of a component footprint and one or more padstacks associated with the component footprint based upon, at least in part, one or more mapping overrides associated with the selected component. In some embodiments, a selected component may specify an original or starting footprint name. Most components using a particular original footprint name have the same mapping for all zone technologies. For example, resistor parts may have different resistances, tolerances or other electrical properties, but they may have the same size and lead pattern. Embodiments of the present disclosure may allow a selected component to specify a standard footprint name used by all similar components having the same size and land pattern. The zone technology information for the standard original footprint name may specify which footprints and padstacks to use based on a given zone technology.

However, in some embodiments, a selected component may share an identical original footprint name as other similar components but include different mapping data for other zones. For example and as shown in FIG. 6, most components may have the original footprint name "R1206". However, component MM_0.1UF may include an original footprint name "R1206_2" for bottom side only and "R1206_3" for embedded placement. In some embodiments, a library component MM_0.1UF may include a mapping override. For example, library component MM_01.UF may specify that the default original footprint name is "R1206". The library component may include one or more mapping overrides; such as when the placement side is the bottom, the original footprint name may be "R1206_2" and when the placement side is embedded, the original footprint name may be "R1206_3". When MM_0.1UF is placed on TOP, the original footprint name may be the same as all other components using original footprint R1206. However, when placed on the bottom side of PCB, it may use R1206_2 as the original footprint name, which is used for mapping lookup. Similarly, when embedded, it uses R1206_3 as the original footprint name for mapping lookup. In some embodiments, this may allow most alternate footprint mapping specification with a single footprint name lookup, with only a few components that carry the extra data to override the original footprint name. In some embodiments, the mapping may be much smaller than if footprint mapping was duplicated for all similar components and may increase the processing speed of component placement process 10, the EDA application 20, and the processing speed of the computing device.

In some embodiments, EDA application 20 may support a variety of languages and/or standards. Some of these may include, but are not limited to, IEEE-standard languages, the OPEN VERIFICATION METHODOLOGY (OVM), the emerging ACCELLERA UNIVERSAL VERIFICATION METHODOLOGY (UVM), and the E REUSE METHODOLOGY (eRM). EDA application 20 may support e, OPEN VERIFICATION LIBRARY (OVL), OVM class library, emerging UVM class library, SystemC®, SystemC Verification Library®, SystemVerilog®, Verilog®, SKILL, VHDL, PSL, SVA, CPF, as well as numerous other languages.

Embodiments of the present disclosure may address new rigid-flex technology which requires a change in the current methodology to use the correct footprint/padstacks for placement in zones with different technologies. Component placement process 10 may use new zone technology and may make a correct placement selection for the end user based upon, at least in part, zone technology information. Component placement process 10 may avoid the need for human expertise to be available to make the footprint selection. In some embodiments utilizing component placement process 10, the requirement for user selection of footprints from a list of possible footprints may be bypassed, thus avoiding any possible human error in the selection process. Additionally, defining the zone technology mapping information for each standard or original footprint name and/or padstack name, instead of for each of many thousands of individual parts, may make defining the zone footprint technology easier and more efficient than defining lists of alternative footprints for each and every component.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for automatically modeling the placement of components in an electronic circuit design:
    receiving, at one or more computing devices, an electronic circuit design at a graphical user interface (GUI) and a selection for a component to be placed within the electronic circuit design;
    detecting a change in the position of the selected component to determine when the selected component is moved into a zone of the electronic circuit design;
    determining a component footprint and one or more padstacks associated with the component footprint for the selected component based upon, at least in part, the position of the selected component within the zone of the electronic circuit design; and
    rendering at least one or more of the component footprint and the one or more padstacks associated with the component footprint on the selected component based upon, at least in part, the position of the selected component.

2. The computer-implemented method of claim 1, further comprising:
    receiving a placement position where the component is to be placed;
    determining the component footprint and the one or more padstacks associated with the component footprint for the component based upon, at least in part, a layer of one or more layers of the zone where the component is to be placed; and
    placing the component, with the component footprint and the one or more padstacks associated with the component footprint, on the layer of the one or more layers of the zone at the placement position.

3. The computer-implemented method of claim 1, wherein determining a component footprint and one or more padstacks associated with the component footprint is further based upon, at least in part, one or more mapping overrides associated with the selected component.

4. The computer-implemented method of claim 1, wherein determining the component footprint is further based upon footprint mapping data associated with at least one of:
    a placement side for the component; and
    an original footprint name associated with the selected component.

5. The computer-implemented method of claim 4, wherein the footprint mapping data includes at least one of:
    default footprint mapping data; and
    zone-specific footprint mapping data.

6. The computer-implemented method of claim 5, further comprising:
    determining whether the zone-specific footprint mapping data includes a zone technology name;
    determining the component footprint for the selected component from the zone-specific footprint mapping data when the zone technology name is included in the zone-specific footprint mapping data; and determining the component footprint for the selected component from default footprint mapping data when at least one of:
the zone technology is not included in the zone-specific footprint mapping data;
there is no zone at the position of the selected component; and
the zone-specific footprint mapping data defined for the zone technology name is empty.

7. The computer-implemented method of claim 6, further comprising:
selecting the original footprint for rendering on the selected component when the default footprint mapping data is empty.

8. The computer-implemented method of claim 6, wherein the footprint mapping data is at least one of:
an indicator of none; and
an ordered list of alternate footprint names for the original footprint name.

9. The computer-implemented method of claim 8, further comprising:
displaying an error indicating that the component is not allowed in the zone when the footprint mapping data is an indicator of none; and
removing the rendering of the component footprint from the selected component.

10. The computer-implemented method of claim 8, further comprising:
selecting a first footprint, from the ordered list of alternate footprint names for the original footprint name, for rendering on the selected component when the footprint mapping data is an ordered list of alternate footprint names.

11. The computer-implemented method of claim 10, further comprising:
providing the ordered list of alternate footprint names on a menu associated with the GUI; and
receiving a selection of an alternate footprint name from the ordered list of alternate footprint names, for rendering on the selected component.

12. The computer-implemented method of claim 1, wherein determining the one or more padstacks associated with the component footprint is further based upon padstack mapping data associated with at least one of:
a placement side for the component; and
an original padstack name associated with the component footprint.

13. The computer-implemented method of claim 12, wherein the padstack mapping data includes at least one of:
default padstack mapping data; and
zone-specific padstack mapping data.

14. The computer-implemented method of claim 13, further comprising:
determining whether the zone-specific padstack mapping data includes a zone technology name;
determining the one or more padstacks from the zone-specific padstack mapping data when the zone technology name is included in the zone-specific padstack mapping data; and
determining the one or more padstacks from the default padstack mapping data when at least one of:
the zone technology is not included in the zone-specific padstack mapping data;
there is no zone at the position of the selected component; and
the zone-specific padstack mapping data defined for the zone technology name is empty.

15. The computer-implemented method of claim 14, further comprising:
selecting the original padstack for rendering on the selected component when the default padstack mapping data is empty.

16. The computer-implemented method of claim 14, wherein the padstack mapping data is an alternate padstack name for the original padstack name.

17. The computer-implemented method of claim 16, further comprising:
selecting the alternate padstack for rendering on the selected component when the padstack mapping data is the alternate padstack name for the original padstack name.

18. A computer-readable storage medium having stored thereon instructions that when executed by a machine result in the following operations:
receiving an electronic circuit design at a graphical user interface (GUI) and a selection for a component to be placed within the electronic circuit design;
detecting a change in the position of the selected component to determine when the selected component is moved into a zone of the electronic circuit design;
determining a component footprint and one or more padstacks associated with the component footprint for the selected component based upon, at least in part, the position of the selected component within the zone of the electronic circuit design; and
rendering at least one or more of the component footprint and the one or more padstacks associated with the component footprint on the selected component based upon, at least in part, the position of the selected component.

19. A system comprising:
a computing device having at least one processor configured to receive an electronic circuit design at a graphical user interface (GUI) and a selection for a component to be placed within the electronic circuit design, the at least one processor configured to detect a change in the position of the selected component to determine when the selected component is moved into a zone of the electronic circuit design, the at least one processor configured to determine a component footprint and one or more padstacks associated with the component footprint for the selected component based upon, at least in part, the position of the selected component within the zone of the electronic circuit design, and the at least one processor configured to render at least one or more of the component footprint and the one or more padstacks associated with the component footprint on the selected component based upon, at least in part, the position of the selected component.

20. A computer-implemented method for automatically modeling the placement of components in an electronic circuit design:
receiving, at one or more computing devices, a selection for a component to be placed within an electronic circuit design;
receiving at least one of:
a position of the selected component within a portion of the electronic circuit design; and
a position where the selected component is to be placed;

determining a component footprint and one or more padstacks associated with the component footprint for the component based upon at least one of:
  the position of the selected component within the portion of the electronic circuit design; and
  a layer of one or more layers of the portion of the electronic circuit design where the component is to be placed;
rendering the component footprint and the one or more padstacks associated with the component footprint on the selected component; and
placing the selected component with the component footprint and the one or more padstacks associated with the component footprint on the layer of the one or more layers of the portion of the electronic circuit design where the selected component is to be placed.

\* \* \* \* \*